(12) United States Patent
Buchwald et al.

(10) Patent No.: US 10,567,093 B1
(45) Date of Patent: Feb. 18, 2020

(54) COMBINED PARALLEL PROCESSING OF SPECTRAL INFORMATION FOR A RADIO FREQUENCY ENVIRONMENT

(71) Applicant: MOTOROLA SOLUTIONS, INC., Chicago, IL (US)

(72) Inventors: Gregory J. Buchwald, Crystal Lake, IL (US); Arthur Christopher Leyh, Spring Grove, IL (US); Bruce D. Mueller, Palatine, IL (US); Michael B. Tiedt, Hampshire, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/202,334

(22) Filed: Nov. 28, 2018

(51) Int. Cl.
*H04W 24/00* (2009.01)
*H04B 17/17* (2015.01)
*H04W 24/04* (2009.01)
*G01R 23/167* (2006.01)
*H04B 17/18* (2015.01)
*H04B 17/318* (2015.01)
*H04W 24/08* (2009.01)

(52) U.S. Cl.
CPC .......... *H04B 17/17* (2015.01); *G01R 23/167* (2013.01); *H04B 17/18* (2015.01); *H04B 17/318* (2015.01); *H04W 24/04* (2013.01); *H04W 24/08* (2013.01)

(58) Field of Classification Search
CPC ..... H04W 24/00; H04W 24/08; H04W 24/02; H04W 88/02; H04W 88/06; H04W 48/16; H04W 48/18; H04W 48/20; H04W 48/12
USPC .... 455/424, 434, 552.1, 67.11, 67.13, 226.3, 455/226.2, 226.1
See application file for complete search history.

(56) References Cited

U.S. PATENT DOCUMENTS

| 4,510,624 | A | 4/1985 | Thompson et al. |
| 6,397,041 | B1 | 5/2002 | Ballard et al. |
| 8,787,836 | B1 | 7/2014 | Carbajal |
| 9,191,037 | B2 * | 11/2015 | Lascari ............... H04B 1/0075 |
| 9,706,559 | B2 | 7/2017 | Jagger et al. |
| 10,033,343 | B2 | 7/2018 | Tasic et al. |
| 10,129,820 | B1 | 11/2018 | Leyh et al. |
| 2011/0117911 | A1 * | 5/2011 | Narang ................. H04W 48/16 455/434 |
| 2013/0202068 | A1 * | 8/2013 | Ly-Gagnon ....... H04W 52/0225 375/343 |
| 2014/0357268 | A1 * | 12/2014 | Dubey .................. H04W 48/16 455/434 |
| 2015/0156645 | A1 * | 6/2015 | Ponnuswamy ....... H04W 24/06 370/241 |

* cited by examiner

*Primary Examiner* — Temica M Beamer
(74) *Attorney, Agent, or Firm* — Michael Best & Friedrich LLP

(57) ABSTRACT

Systems and methods for combined parallel processing of spectral information in a radio frequency environment. One example method includes controlling, with an electronic processor, a wideband receiver coupled to a receive path to scan a band of interest. The method includes receiving, from the wideband receiver, wideband scan data for the band of interest. The method includes identifying, based on the wideband scan data, a spectral region including a signal of interest. The method includes controlling, with the electronic processor, a narrowband receiver coupled to the receive path in parallel with the wideband receiver to collect a sample of the signal of interest.

22 Claims, 4 Drawing Sheets

COMBINED PARALLEL PROCESSING OF SPECTRAL INFORMATION FOR A RADIO FREQUENCY ENVIRONMENT

BACKGROUND OF THE INVENTION

Radio frequency infrastructure sites, for example telecommunication towers and the like, generally combine multiple transmitters. In many infrastructure sites, the transmitters transmit communications using common antennas. The health of the transmitters is not always known until a transmitter, or other component in a radio frequency chain, fails. In addition, such sites often include equipment from multiple operators, which may cause artifacts that degrade the performance of other systems. Hence, evaluation of such radio frequency sites may be important to ensure continuity of telecommunications, which may be especially important when such radio frequency sites include emergency service telecommunications equipment.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
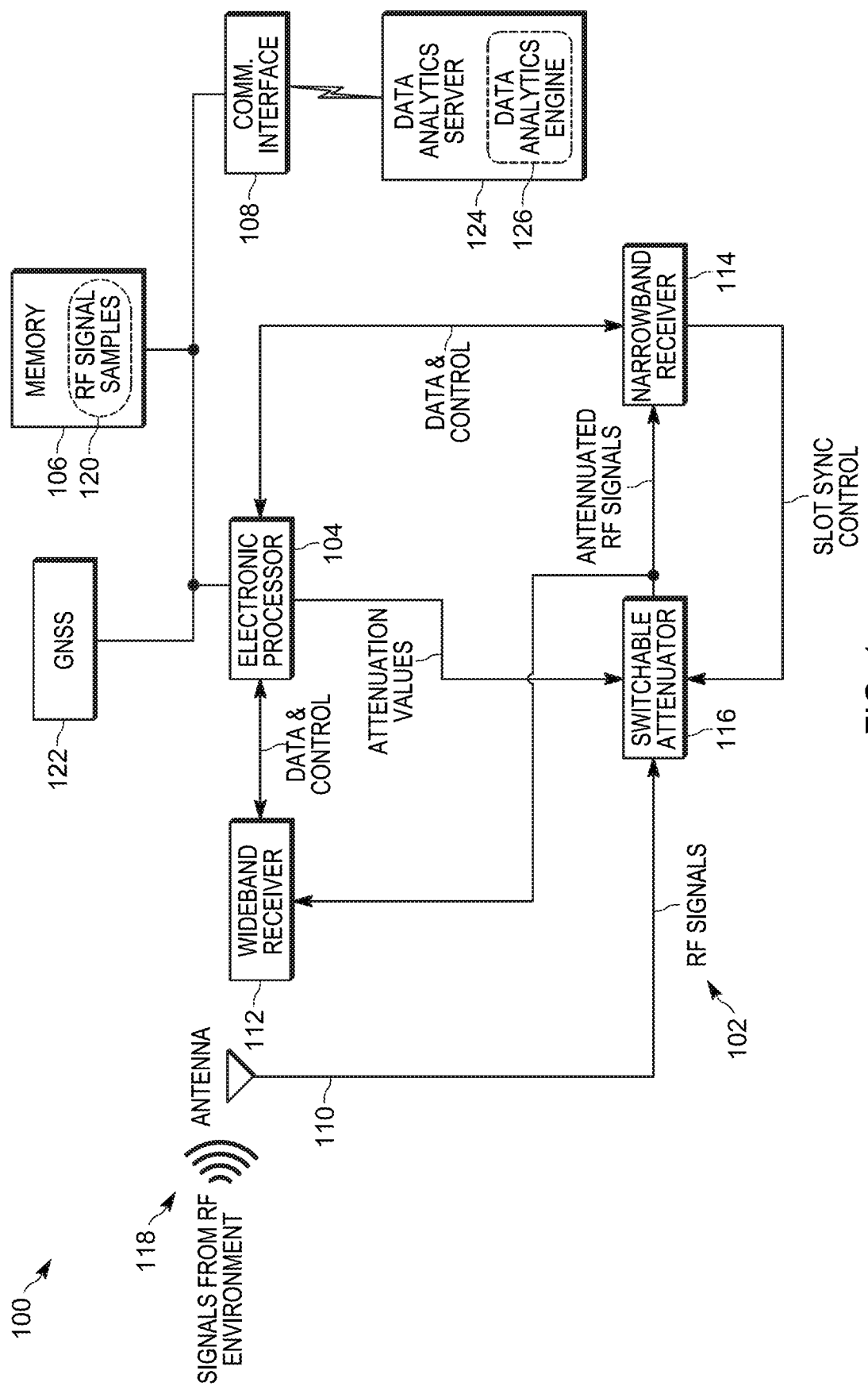
FIG. 1 is a diagram of a radio frequency monitoring system, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As noted, monitoring and evaluation of radio frequency (radio frequency) infrastructure is important to ensure continuity of telecommunications. Such radio frequency sites may include bolted metal-to-metal and metal-to-oxidized-metal components and/or guy wires, which may cause the passive generation of intermodulation distortion issues over time. In addition, degraded system components, (for example, antennas, feedlines, radio frequency cabling, and/ or other cabling) within close proximity of a radiating radio frequency site may also produce undesired spectral components. In addition, when radio frequency sites include emergency service telecommunications equipment, the radio frequency sites may have to meet regulatory requirements, such as FCC (Federal Communications Commission) and/or ETSI (European Telecommunications Standards Institute) requirements. If any of the emergency service telecommunications equipment start to degrade, the degradation may cause non-compliance with regulatory requirements. Degradation may also adversely impact the performance of emergency service telecommunications equipment.

Some radio frequency sites house multiple systems. In these densely populated radio frequency environments, an operator can generally directly track its own transmitters. Although this tracking process can uncover degradations or deficiencies in the operator's system, this kind of tracking relies on a hard or wired connection to system controllers and unknown external influences may limit the effectiveness of the data gathering. It is often desirable to monitor systems without a hard connection to system controllers. For example, mobile monitoring makes it easier to track a system operating at multiple sites over a geographic area. However, this monitoring without a hard connection limits the ability to control signal attenuation, which affects the dynamic range of the measurements. Currently, systems are monitored using a narrowband sensor to scan at high resolution (for example, at 3.125 kHz or less) sequentially over time. Using a narrowband sensor limits the speed at which a snapshot of the monitored spectrum can be taken. As a consequence, signals of interest (that is, radio frequency signals indicating a fault or problem) may be missed. Existing scanning methods use the narrowband sensor inefficiently. Accordingly, systems and methods are provided herein for, among other things, combined parallel processing of spectral information for a radio frequency environment.

Embodiments provided herein include, among other things, a wideband sensor deployed in parallel with a narrowband sensor. In some embodiments, the wideband receiver is able to more quickly identify frequencies of interest, which are used to direct the narrowband receiver's scanning and sampling. Using some embodiments, monitoring systems are better able to determine signal attenuation for the narrowband sensor without a priori knowledge of the system being monitored. Some embodiments also take into account external influences on the sensor's dynamic range. Some embodiments are also able to determine that artifacts detected are real, and not functions of the monitoring sensor's nonlinearities. Some embodiments include a dual slot attenuation control, which reduces bad data caused by incorrect attenuation values. Data validation reduces the need for rescanning, saving time and allowing for more detailed scanning. Some embodiments described herein therefore result in more efficient use of monitoring and communication system resources, and the improved operation of the monitoring and communication systems for users.

One example embodiment provides a system for combined parallel processing of spectral information for a radio frequency environment. The system includes a wideband receiver coupled to a receive path, a narrowband receiver coupled to the receive path in parallel with the wideband receiver, and an electronic processor. The electronic processor is coupled to the wideband receiver and the narrowband receiver. The electronic processor is configured to control the wideband receiver to scan a band of interest. The electronic processor is configured to receive, from the wideband receiver, wideband scan data for the band of interest. The electronic processor is configured to identify, based on the wideband scan data, a spectral region including a signal of interest. The electronic processor is configured to control the narrowband receiver to collect a sample of the signal of interest.

Another example embodiment provides a method for combined parallel processing of spectral information for a radio frequency environment. The method includes controlling, with an electronic processor, a wideband receiver coupled to a receive path to scan a band of interest. The method includes receiving, from the wideband receiver, wideband scan data for the band of interest. The method includes identifying, based on the wideband scan data, a spectral region including a signal of interest. The method includes controlling, with the electronic processor, a narrowband receiver coupled to the receive path in parallel with the wideband receiver to collect a sample of the signal of interest.

For ease of description, some or all of the example systems presented herein are illustrated with a single exemplar of each of its component parts. Some examples may not describe or illustrate all components of the systems. Other example embodiments may include more or fewer of each of the illustrated components, may combine some components, or may include additional or alternative components.

FIG. 1 illustrates an example radio frequency monitoring system 100. The system includes a receive path 102, an electronic processor 104, a memory 106, and a communication interface 108. The illustrated components, along with other various modules and components are coupled to each other by or through one or more connections that enable communication therebetween. The connections may include control or data buses. The use of control and data buses for the interconnection between and exchange of information among the various modules and components would be apparent to a person skilled in the art in view of the description provided herein.

Radio frequency environments (for example, a radio frequency infrastructure site) include, for example, radio transmitters, which transmit signals at given respective frequencies (for example using channels and/or channel communication). Such sites include electrical and structural components, which may degrade over time. Component degradation may introduce intermodulation distortion frequency components to the aggregate spectrum of frequencies transmitted by the transmitters. Thus, the presence of such intermodulation distortion frequency products, a change in such intermodulation distortion frequency products over time, or both, may indicate a degradation of the radio frequency site for example, the early stages of failure in component loads, power amplifiers, and the like. Degradation of the radio frequency site may also be indicated by a decrease in transmitter intensity over time. In addition, the presence of other radio frequency signals in the region of the radio frequency site may contribute to at least temporary degradation of the radio frequency site. These degrading signals may include nearby strong transmitters, signals generated by unintentional sources that nonetheless degrade the effectiveness of the communications system of interest on the uplink or downlink portion of the system, or intentional signals generated with the intent of causing disruption of communications effectiveness. These other signals may originate at, for example, nearby radio frequency sites, jamming equipment, and the like.

The receive path 102 of the system 100 includes an antenna 110, a wideband receiver 112, a narrowband receiver 114. These components are used to, among other things, to monitor radio frequency signals that may cause degradation. In the example illustrated in FIG. 1, the wideband receiver 112 and the narrowband receiver 114 are coupled in parallel with one another in the receive path 102. The illustrated example also includes a dual-slot programmable attenuator 116 coupled in series with the wideband receiver 112 and the narrowband receiver 114, between the antenna 110 and the receivers. Some embodiments of the system 100 omit the dual-slot programmable attenuator. The antenna 110, wideband receiver 112, narrowband receiver 114, and dual-slot programmable attenuator 116 are communicatively coupled with a means suitable for conveying radio frequency signals between them (for example, wires, coaxial cable, waveguides, and the like). The system 100, when constructed and operated, is generally positioned proximate to a radio frequency environment (not shown), such that the antenna 110 can receive radio frequency signals produced by the radio frequency infrastructure site and signals present in the region of the radio frequency site.

The wideband receiver 112 is in communication with the antenna 110 through the dual-slot programmable attenuator 116. The electronic processor 104 controls the wideband receiver 112 to acquire scans of channels in a radio frequency band of interest, for example, for a range of frequencies transmitted by a radio frequency site. Scans may include scanning for received signal strength intensity (RSSI) as a function of frequency, which is generally indicative of power received at an input to the wideband receiver 112 (for example, from the antenna 110). In some embodiments, the wideband receiver 112 is controllable to scan several MHz or more every 200-500 milliseconds, with a frequency resolution of 12.5 kHz. In some embodiments, the wideband receiver 112 has a dynamic range of 80 dB.

The narrowband receiver 114 in communication with the antenna 110 through the dual-slot programmable attenuator 116. As described more particularly below, the electronic processor 104 controls the dual-slot programmable attenuator 116 to switch the radio frequency signals received from the antenna 110 between one of two paths between the antenna 110 and an input to the narrowband receiver 114. The dual-slot programmable attenuator 119 thereby attenuates (at one of two programmable attenuation levels) the power of the radio frequency signals received at the antenna 110 prior to the radio frequency signals being received by the narrowband receiver 114. In some embodiments, the narrowband receiver 114 is controllable to perform deep scans of a frequency range at higher frequency resolution relative to the wideband receiver 112. For example, utilizing well-known Fast Fourier Transform (FFT) techniques, the wideband receiver 112 may effectively scan through analysis a 20 MHz range at a frequency resolution of 12.5 kHz within 200 milliseconds or less, whereas the same scan may take the narrowband receiver 114 six minutes or longer. In some embodiments, the narrowband receiver 114 has a frequency resolution of 3.5 kHz or less. In contrast to the wideband receiver 112, the narrowband receiver 114 has a dynamic range of 100 dB or more.

The electronic processor 104 controls the narrowband receiver 114 to acquire scans of a radio frequency signal or signals of interest. Such scans may include scanning for received signal strength intensity (RSSI) as a function of frequency, which is generally indicative of power received at an input to the narrowband receiver 114 (for example, from the dual-slot programmable attenuator 119). It should be noted that, while the terms scan and scanning are used here to describe sequentially scanning through frequencies, the terms scan and scanning may also include acquiring the RSSI data in a frequency binning process and/or acquiring RSSI data in frequency bins concurrently.

The range of frequencies over which the radio frequency site transmits, and over which the wideband receiver 112 and the narrowband receiver 114 are configured to scan, may be dependent on a type of communication network for which the radio frequency site is being used. For example, the radio frequency site may include components of a Project 25 (P25) emergency services network, operating at frequencies around 700 MHz, with channel bandwidth being in a range of 6.25 kHz to 12.5 kHz (in other words, the different frequencies at which the radio frequency site may transmit may be separated by 6.25 kHz to 12.5 kHz). Similarly, the radio frequency site may include components of a Long-Term Evolution (LTE) cellular phone network, operating at frequencies in a range of about 450 MHz to about 6 GHz (depending on jurisdiction), with channel bandwidth being in a range of 1.4 MHz to 20 MHz (depending on choice of deployment method or regulatory jurisdiction). However, the wideband receiver 112, the narrowband receiver 114, and other components of the system 100 may be adapted for monitoring and evaluating any type of communication network.

The electronic processor 104 may include one or more microprocessors, an application-specific integrated circuit (ASIC), or another suitable electronic device. The electronic processor 104 is configured to obtain and provide information (for example, from the memory 106 and/or the communication interface 108), and process the information by executing one or more software instructions or modules, capable of being stored, for example, in a random access memory ("RAM") area of the memory 106 or a read only memory ("ROM") of the memory 106 or another non-transitory computer readable medium (not shown). The software can include firmware, one or more applications, program data, filters, rules, one or more program modules, and other executable instructions. The electronic processor 104 is configured to retrieve from the memory 106 and execute, among other things, software related to the control processes and methods described herein. The memory 106 can include one or more non-transitory computer-readable media, and includes a program storage area and a data storage area. The program storage area and the data storage area can include combinations of different types of memory, as described herein. In the embodiment illustrated, the memory 106 stores, among other things, radio frequency signal samples 120 acquired from the wideband receiver 112 and the narrowband receiver 114.

In some embodiments, the system 100 may be deployed as a mobile system, for example, on a vehicle. In such embodiments, the electronic processor 104 determines the location of the system 100 using the global navigation satellite system (GNSS) 122. The GNSS 122 receives radiofrequency signals from orbiting satellites using one or more antennas and receivers (not shown). The global navigation satellite system 122 determines geo-spatial positioning (that is, latitude, longitude, altitude, and speed) for the system 100 based on the received radiofrequency signals. Global navigation satellite systems are known, and will not be described in greater detail.

The communication interface 108 is configured to receive input and to provide system output. The communication interface 108 includes hardware for communicating over one or more wired or wireless communication networks or connections. For example, in some embodiments, the communication interface 108 includes at least one transceiver. In some embodiments, the transceivers are combined transmitter-receiver components. In other embodiments, the transceivers include separate transmitter and receiver components. The electronic processor 104 is configured to control the communication interface 108 to transmit and receive data to and from, for example, a data analytics server 124. The data analytics server 124 is a cloud-based or other remote server, which includes a data analytics engine 126 for processing radio frequency signal samples collected by the system 100. In some embodiments, communications with the data analytics server 124 occur via distinct logical or physical interfaces. The electronic processor 104 and the communication interface 108 may include various digital and analog components, which for brevity are not described herein and which may be implemented in hardware, software, or a combination of both.

Figure 2:
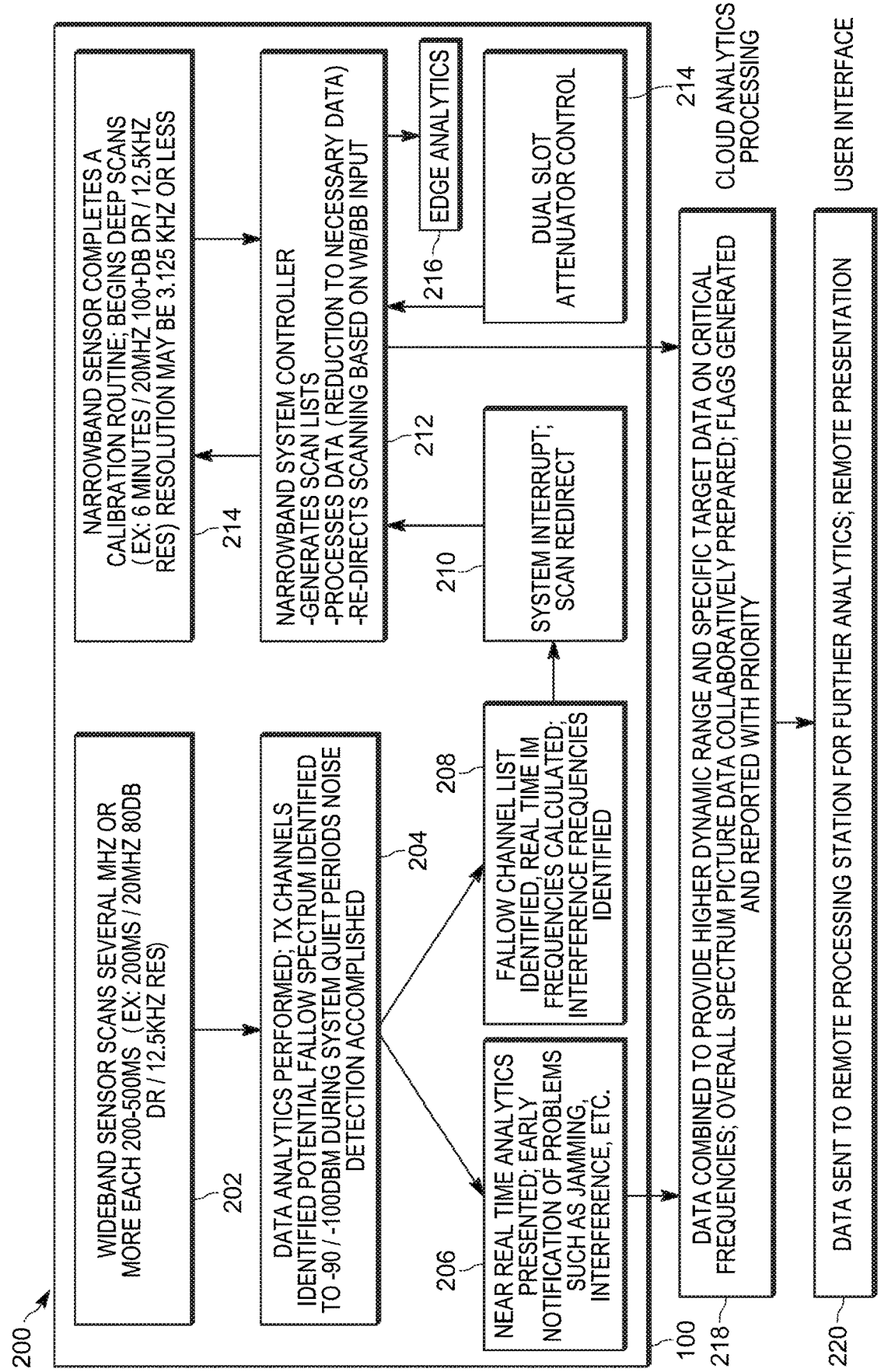
FIG. 2 is a flow diagram illustrating the operations of the system of FIG. 1.

FIG. 2 illustrates a flow diagram 200, illustrating the operation of one example embodiment of the radio frequency monitoring system 100. Overall, the system 100 operates the wideband receiver 112 to feed forward to the narrowband receiver 114, which operates in parallel with the wideband receiver 112. The wideband receiver 112 has a more limited dynamic range and less frequency resolution, as compared to the narrowband receiver 114. However, this allows the wideband receiver 112 to react more quickly to a changing spectral environment. In this fashion, the combined action of the wideband receiver 112 and electronic processor 104 form a real-time scheduler for precise control and direction of the narrowband receiver 114 as well as control of the attenuator stage 116 for at least one time slot per scanned frequency instance.

At block 202, the wideband receiver 112 scans a radio frequency range, as noted above, sending wideband radio frequency samples to the electronic processor 104.

At block 204, data analytics are performed on the received wideband samples, for example, by the electronic processor 104. In some embodiments, Fast Fourier Transforms (FFTs) are performed on the wideband samples to analyze the narrowband signal powers. Using the data analytics, the electronic processor 104 can identify active transmit channels for the radio frequency environment and potential fallow (unutilized or underutilized) radio frequency spectrum (for example, to −90/−100 dBm) during system quiet periods. The data analytics also detect the noise floor for the radio frequency environment.

At block 206, near real-time analytics are presented (for example, by transmitting to an external computing device with the communication interface 108). In some embodiments, the analytics include notification of problems, for example, jamming or interference. At block 208, a fallow channel list is identified, real-time intermodulation frequencies are calculated, and interference frequencies are identified. Each of the foregoing may be used to direct the narrowband receiver 114 to scan particular frequencies. For example, at block 210, scan redirect information is sent to the narrowband receiver system controller. In some embodiments, the electronic processor 104 controls both the wideband receiver 112 and the narrowband receiver 114. In some embodiments, the receivers are controlled by separate processors. At block 212, the narrowband system controller redirects the narrowband receiver 114 to scan for radio frequency signals of interest based on the analysis of the wideband samples. For example, the narrowband receiver 114 may be controlled to perform deep scans on the fallow channel list to further gauge the likelihood that the channels are unused. In another example, the narrowband receiver 114 may be controlled to perform deep scans on the interference frequencies.

At block 214, the narrowband sensor 114 calibrates itself, based on the range being scanned, and begins deep scans based on the redirection. Narrowband samples for the signal(s) of interest are collected and fed back to the narrowband system controller (for example, the electronic processor 104). In some embodiments, as noted above, the electronic processor 104 controls the dual-slot programmable attenuator 116, based on signal strength readings from the wideband receiver 112, to attenuate radio frequency signals received by the narrowband receiver 114 (at block 214). Attenuation is controlled to extend the dynamic range of the narrowband receiver 114, and to avoid overload during the narrowband deep scans. In some embodiments, multiple samples may be taken at different attenuations to validate whether the radio frequency signal measured is an actual signal, and not a non-linear artifact.

In some embodiments, at block 216, the electronic processor 104 performs edge analytics to detect real-time problems (for example, intermodulation distortion products) as described in detail below. In some embodiments, the system 100 provides data and analytics from both the wide and narrowband scans to a cloud-based analytics system (at block 218). Such systems may combine data to provide a higher dynamic range and specific target data for critical frequencies. In some embodiments, an overall spectrum picture is prepared (for example, using scan data from multiple systems, locations, times, or combinations of the foregoing). Finally, at block 220, combined data is sent to a remote processing station (for example, the data analytics server 124) for further processing and remote presentation of results (for example, via a user interface).

Figure 3:
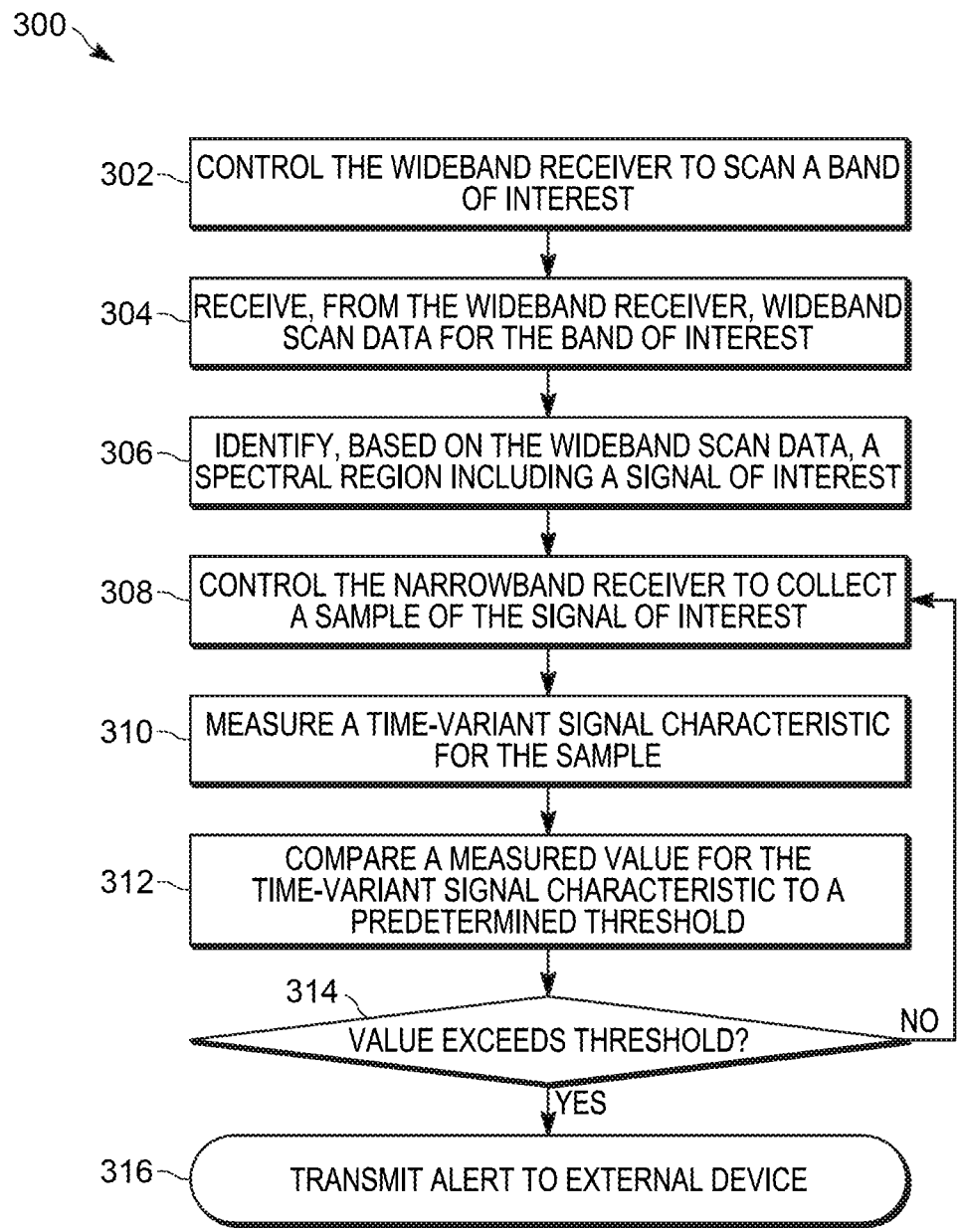
FIG. 3 is a flowchart of a method for operating the system of FIG. 1, in accordance with some embodiments.

As noted, narrowband deep scans performed over a large radio frequency range may not be effective at identifying certain faults in radio frequency infrastructure. FIG. 3 illustrates an example method 300 for analyzing radio frequency spectrum using combined parallel processing of spectral information for a radio frequency environment. As an example, the method 300 is described as being performed by the system 100 and, in particular, the electronic processor 104. However, it should be understood that in some embodiments, portions of the method 300 are performed by one or more other electronic processors or other devices, including for example, embedded processors in the wideband detector 112 and the narrowband detector 114, and the data analytics server 124. In some embodiments, the method 300 is repeated periodically or continuously to account for changes in radio frequency environments over time, as described herein.

In the example illustrated in FIG. 3, at block 302, the electronic processor 104 controls the wideband receiver to scan a band of interest. The band of interest is a radio frequency range chosen based on the nature of the radio frequency site being monitored (for example, a land mobile radio, or a cellular site).

At block 304, the electronic processor 104 receives, from the wideband receiver, wideband scan data for the band of interest. The wideband scan data includes digitized data representing signal strength (for example, in dBm) for particular frequencies over time.

At block 306, the electronic processor 104 identifies, based on the wideband scan data, a spectral region including a signal of interest. As noted above with respect to FIG. 2, in some embodiments, Fast Fourier Transforms are performed on the wideband scan data to determine one or more signals of interest. Examples of signals of interest include interference frequencies, intermodulation distortion product frequencies, and potential fallow channels. The spectral region is a subset of the band of interest, which subset includes a signal or signals of interest.

At block 308, the electronic processor 104 controls the narrowband receiver 114 to collect a sample of the signal of interest. For example, the electronic processor 104 directs the narrowband receiver 114 to perform one or more deep scans over the spectral region identified at block 306, and provide samples of the deep scan(s).

In some embodiments, in response to identifying the spectral region, the electronic processor 104 also controls the narrowband receiver 114 to collect other data, including signal bandwidth data, a signal quality factor, a signal characteristic for the spectral region, and the like.

As illustrated in FIG. 3, in some embodiments, the method 300 iterates to collect and analyze a plurality of samples of the signal of interest over a period of time. At block 310, the electronic processor 104 measures a time-variant signal characteristic (for example, RSSI) for the sample (collected at block 308). In some embodiments, the electronic processor 104 receives a measurement of the time-variant signal characteristic directly from the narrowband receiver 114 (for example, as metadata) rather than measuring the characteristic.

At block 312, the electronic processor 104 compares a measured value for the time-variant signal characteristic to a predetermined threshold for the characteristic. For example, the predetermined threshold may be an RSSI value, which, when exceeded, is an indicator that the signal of interest is likely to interfere with one of the transmit channels for the radio frequency site being monitored. When the measured value does not exceed the predetermined threshold, at block 314, the electronic processor 104 controls the narrowband receiver to collect another sample (at block 308) for analysis (at blocks 310-316).

At block 314, when the measured value exceeds the predetermined threshold, the electronic processor 104, at block 316, transmits an alert message to an external device. For example, an alert message may be sent to the data analytics server 124, or to a cellular phone (for example, as an SMS message) to alert an administrator that an interfering signal has been identified. In another example, an intermodulation signal may cause an alert message to be sent indicating that a fault exists at a particular radio frequency site. In some embodiments, the electronic processor 104 receives and tracks location data (for example, using the GNSS 122) for the sample over time. Using such data, more information can be gleaned as to the location of an interference source, a driving routes of an interference source, and the like. In such embodiments, the alert message includes the location data.

In some embodiments, in response to identifying the spectral region, the system 100 controls the narrowband receiver 114 to scan a reduced set of frequencies (as compared to the overall band of interest) within the spectral region. For example, the reduced set of frequencies may correspond to a set of potential fallow channels identified for the band of interest. In such embodiments, the electronic processor 104 receives, from the narrowband receiver, narrowband scan data for the reduced set of frequencies. The electronic processor 104 analyzes the narrowband scan data to ascertain a potential third order intermodulation distortion frequency. When a potential third order intermodulation distortion frequency is ascertained, the electronic processor 104 controls the narrowband receiver 114 to determine an RSSI value for the potential third order intermodulation distortion frequency.

In some embodiments, the electronic processor 104 analyzes the narrowband scan data to determine a fifth or higher order intermodulation distortion product, and controls the narrowband receiver to determine an RSSI value for the fifth or higher order intermodulation distortion product.

Figure 4:
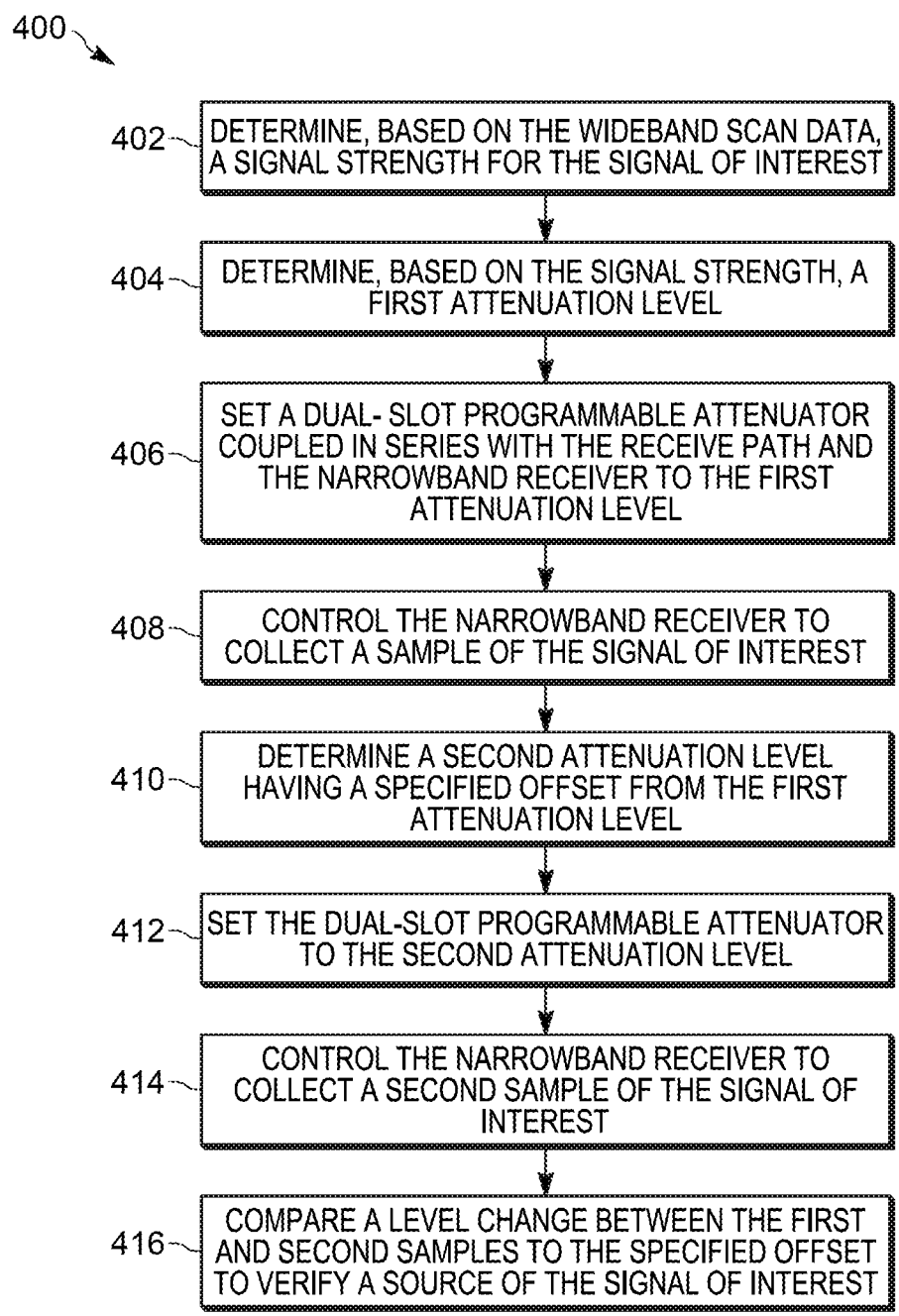
FIG. 4 is a flowchart of a method for operating the system of FIG. 1, in accordance with some embodiments.

As noted, in some embodiments, the system 100 includes a dual-slot programmable attenuator coupled in series with the receive path and the narrowband receiver. FIG. 4 is a flow chart illustrating an example method 400 for operating such embodiments. At block 402, the electronic processor 104 determines, based on the wideband scan data, a signal strength for the signal of interest, as noted above.

At block 404, the electronic processor 104 determines, based on the signal strength, a first attenuation level. In some embodiments, the electronic processor 104 is configured to determine the first attenuation level by determining an attenuation level that causes the narrowband receiver to operate in its linear region while receiving the signal of interest. At block 406, the electronic processor 104 sets the dual-slot programmable attenuator 116 to the first attenuation level.

At block 408, the electronic processor 104 controls the narrowband receiver 114 to collect a sample of the signal of interest. In some embodiments, the sample is processed according to the method 300, as noted above.

In some embodiments, at block 410, the electronic processor 104 determines a second attenuation level having a specified offset from the first attenuation level. In some embodiments, the electronic processor 104 determines the specified offset based on an expected peak received power level for the signal of interest. At block 412, the electronic processor 104 sets the dual-slot programmable attenuator 116 to the second attenuation level.

At block 414, the electronic processor 104 controls the narrowband receiver 114 to collect a second sample of the signal of interest.

At block 416, the electronic processor 104 compares a level change between the first and second samples to the specified offset to verify a source of the signal of interest. For example, in some embodiments, the electronic processor 104 determines a first RSSI value for the first sample and a second RSSI value for the second sample. In such embodiments, the electronic processor selects either the first sample or the second sample based on the first RSSI value, the second RSSI value, the first attenuation level, and the second attenuation level.

For example, in some embodiments, the electronic processor 104 determines the selected sample by determining which one of the first attenuation level and the second attenuation level has the lesser value. In some embodiments, the determination is made after calibrating the samples for the attenuation. This prevents the higher attenuation level from burying the signal in the noise, while the lower attenuation may allow the signal to emerge from the noise floor. The sample with the lower attenuation yields a lower number when calibrating out the attenuation.

In some embodiments, the electronic processor 104 determines a difference between the first and second RSSI values. When the difference exceeds a threshold, the electronic processor determines the selected sample by determining which one of the first attenuation level and the second attenuation level has the lesser value.

Regardless of how the sample is selected, in some embodiments, the electronic processor 104 transmits the selected sample to a data analytics engine for further analysis.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 20%, in another embodiment within 10%, in another embodiment within 2% and in another embodiment within 1%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A system for analyzing radio frequency spectrum, the system comprising:
   a wideband receiver coupled to a receive path;
   a narrowband receiver coupled to the receive path in parallel with the wideband receiver; and
   an electronic processor, coupled to the wideband receiver and the narrowband receiver and configured to
      control the wideband receiver to scan a band of interest;
      receive, from the wideband receiver, wideband scan data for the band of interest;
      identify, based on the wideband scan data, a spectral region including a signal of interest;
      control the narrowband receiver to collect a plurality of samples of the signal of interest over a period of time; and
      for each of the plurality of samples,
         measure a time-variant signal characteristic;
         compare a measured value for the time-variant signal characteristic to a predetermined threshold; and
         when the measured value exceeds the threshold, transmit an alert message to an external device.

2. The system of claim 1, wherein the electronic processor is configured to:
   in response to identifying the spectral region, control the narrowband receiver to scan a reduced set of frequencies within the spectral region;
   receive, from the narrowband receiver, narrowband scan data for the reduced set of frequencies;
   analyze the narrowband scan data to ascertain a potential third order intermodulation distortion frequency; and
   control the narrowband receiver to determine an RSSI value for the potential third order intermodulation distortion frequency.

3. The system of claim 2, wherein the electronic processor is configured to:
   analyze the narrowband scan data to determine a fifth or higher order intermodulation distortion product; and
   control the narrowband receiver to determine an RSSI value for the fifth or higher order intermodulation distortion product.

4. The system of claim 1 wherein the electronic processor is configured to, in response to identifying the spectral region, control the narrowband receiver to collect at least one selected from the group consisting of signal bandwidth data, a signal quality factor, and a signal characteristic for the spectral region.

5. The system of claim 1, further comprising:
   a dual-slot programmable attenuator coupled in series with the receive path and the narrowband receiver;
   wherein the electronic processor is coupled to the dual-slot programmable attenuator and configured to
      determine, based on the wideband scan data, a signal strength for the signal of interest;
      determine, based on the signal strength, a first attenuation level; and
      set the dual-slot programmable attenuator to the first attenuation level.

6. The system of claim 5, wherein the electronic processor is configured to determine the first attenuation level by determining an attenuation level that causes the narrowband receiver to operate in its linear region while receiving the signal of interest.

7. The system of claim 5, wherein the electronic processor is configured to:
   determine a second attenuation level having a specified offset from the first attenuation level;
   set the dual-slot programmable attenuator to the second attenuation level;
   control the narrowband receiver to collect a second plurality of samples of the signal of interest; and
   compare a level change between the plurality of samples and the second plurality of samples to the specified offset to verify a source of the signal of interest.

8. The system of claim 7, wherein the electronic processor is configured to determine the specified offset based on an expected peak received power level.

9. The system of claim 7, wherein the electronic processor is configured to:
   determine a first RSSI value for the plurality of samples;
   determine a second RSSI value for the second plurality of samples;
   select one from the group consisting of the plurality of samples and the second plurality of samples based on the first RSSI value, the second RSSI value, the first attenuation level, and the second attenuation level; and
   transmit the selected plurality of samples to a data analytics engine.

10. The system of claim 9, wherein the electronic processor is configured to determine the selected plurality of samples by determining which one of the group consisting of the first attenuation level and the second attenuation level has the lesser value.

11. The system of claim 9, wherein the electronic processor is configured to:
   determine a difference between the first and second RSSI values; and
   when the difference exceeds a threshold, determine the selected plurality of samples by determining which one of the group consisting of the first attenuation level and the second attenuation level has the lesser value.

12. A method for analyzing radio frequency spectrum, the method comprising:
   controlling, with an electronic processor, a wideband receiver coupled to a receive path to scan a band of interest;
   receiving, from the wideband receiver, wideband scan data for the band of interest;

identifying, based on the wideband scan data, a spectral region including a signal of interest;
controlling, with the electronic processor, a narrowband receiver coupled to the receive path in parallel with the wideband receiver to collect a plurality of samples of the signal of interest over a period of time; and
for each of the plurality of samples,
measuring a time-variant signal characteristic;
comparing a measured value for the time-variant signal characteristic to a predetermined threshold; and
when the measured value exceeds the threshold, transmitting an alert message to an external device.

13. The method of claim 12, further comprising:
in response to identifying the spectral region, controlling the narrowband receiver to scan a reduced set of frequencies within the spectral region;
receiving, from the narrowband receiver, narrowband scan data for the reduced set of frequencies;
analyzing the narrowband scan data to ascertain a potential third order intermodulation distortion frequency; and
controlling the narrowband receiver to determine an RSSI value for the potential third order intermodulation distortion frequency.

14. The method of claim 13, further comprising:
analyzing the narrowband scan data to determine a fifth or higher order intermodulation distortion product; and
controlling the narrowband receiver to determine an RSSI value for the fifth or higher order intermodulation distortion product.

15. The method of claim 12, further comprising:
in response to identifying the spectral region, controlling the narrowband receiver to collect at least one selected from the group consisting of signal bandwidth data, a signal quality factor, and a signal characteristic for the spectral region.

16. The method of claim 12, further comprising:
determining, based on the wideband scan data, a signal strength for the signal of interest;
determining, based on the signal strength, a first attenuation level; and
setting a dual-slot programmable attenuator coupled in series with the receive path and the narrowband receiver to the first attenuation level.

17. The method of claim 16, wherein determining the first attenuation level includes determining an attenuation level that causes the narrowband receiver to operate in its linear region while receiving the signal of interest.

18. The method of claim 16, further comprising:
determining a second attenuation level having a specified offset from the first attenuation level;
setting the dual-slot programmable attenuator to the second attenuation level;
controlling the narrowband receiver to collect a second plurality of samples of the signal of interest; and
comparing a level change between the plurality of samples and the second plurality of samples to the specified offset to verify a source of the signal of interest.

19. The method of claim 18, further comprising:
determining the specified offset based on an expected peak received power level.

20. The method of claim 18, further comprising:
determining a first RSSI value for the plurality of samples;
determining a second RSSI value for the second plurality of samples;
selecting one from the group consisting of the plurality of samples and the second plurality of samples based on the first RSSI value, the second RSSI value, the first attenuation level, and the second attenuation level; and
transmitting the selected plurality of samples to a data analytics engine.

21. The method of claim 20, further comprising:
determining the selected plurality of samples by determining which one of the group consisting of the first attenuation level and the second attenuation level has the lesser value.

22. The method of claim 20, further comprising:
determining a difference between the first and second RSSI values; and
when the difference exceeds a threshold, determining the selected sample by determining which one of the group consisting of the first attenuation level and the second attenuation level has the lesser value.

* * * * *